United States Patent
Furuki et al.

(10) Patent No.: US 10,571,613 B2
(45) Date of Patent: Feb. 25, 2020

(54) CIRCULARLY POLARIZING PLATE AND DISPLAY DEVICE

(71) Applicant: FUJIFILM Corporation, Tokyo (JP)

(72) Inventors: Yusuke Furuki, Kanagawa (JP); Masakane Muto, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 154 days.

(21) Appl. No.: 15/703,293

(22) Filed: Sep. 13, 2017

(65) Prior Publication Data

US 2018/0003875 A1 Jan. 4, 2018

Related U.S. Application Data

(63) Continuation of application No. PCT/JP2016/060102, filed on Mar. 29, 2016.

(30) Foreign Application Priority Data

Mar. 30, 2015 (JP) .................................. 2015-068881

(51) Int. Cl.
*G02B 5/30* (2006.01)
*B32B 7/02* (2019.01)
(Continued)

(52) U.S. Cl.
CPC .............. *G02B 5/3016* (2013.01); *B32B 7/02* (2013.01); *H01L 27/3232* (2013.01);
(Continued)

(58) Field of Classification Search
CPC ........ G02B 5/3016; G02B 5/305; G02B 1/00; G02B 1/08; G02B 5/30; G02B 5/3025;
(Continued)

(56) References Cited

U.S. PATENT DOCUMENTS

2014/0253847 A1* 9/2014 Saneto .............. G02F 1/133528
349/96
2014/0254014 A1* 9/2014 Ishiguro ............... G02B 5/3083
359/489.07

(Continued)

FOREIGN PATENT DOCUMENTS

JP 2014-010325 A 1/2014
JP 2014-167922 A 9/2014

(Continued)

OTHER PUBLICATIONS

International Search Report issued in PCT/JP2016/060102 dated May 10, 2016.

(Continued)

*Primary Examiner* — Arnel C Lavarias
(74) *Attorney, Agent, or Firm* — Edwards Neils LLC; Jean C. Edwards, Esq.

(57) ABSTRACT

The present invention provides a circularly polarizing plate capable of reducing the amount of change in tint and a difference in reflectivity while achieving thinning of a display device and a display device having the same. The circularly polarizing plate of the present invention includes a polarizer, a transparent support, an optically anisotropic layer including a liquid crystal compound in this order, in which the optically anisotropic layer satisfies Expression (1) and the transparent support has a thickness of 50 μm or less and satisfied Expression (2), $100 \leq Re(550) \leq 180$ nm . . . (1) and $1.00 \leq R \leq 1.20$ . . . (2), in Expression (1), $Re(550)$ represents an in-plane retardation of the optically anisotropic layer at a wavelength of 550 nm and in Expression (2), R represents a ratio between a maximum value and a minimum value of modulus of elasticity of the transparent support.

16 Claims, 2 Drawing Sheets

(51) Int. Cl.
*H05B 33/22* (2006.01)
*H01L 51/52* (2006.01)
*H01L 27/32* (2006.01)

(52) U.S. Cl.
CPC ......... *H01L 51/5281* (2013.01); *H05B 33/22* (2013.01); *B32B 2307/412* (2013.01); *B32B 2307/42* (2013.01); *B32B 2309/105* (2013.01); *G02B 5/305* (2013.01)

(58) Field of Classification Search
CPC .... G02B 5/3033; G02B 5/3083; G02B 27/28; G02B 27/286; B32B 7/02; B32B 2307/412; B32B 2307/42; B32B 2309/105; H01L 27/3232; H01L 51/5281; H05B 33/22; G02F 1/13; G02F 1/1306; G02F 1/133528; G02F 2001/133531; G02F 1/133536; G02F 2001/133541; G02F 1/13363
USPC ............ 359/489.07, 483.01, 487.01, 487.02, 359/489.08, 489.11, 489.12, 489.13; 349/117–119, 96, 98, 193, 194; 362/19; 353/20
See application file for complete search history.

(56) References Cited

U.S. PATENT DOCUMENTS

| | | | |
|---|---|---|---|
| 2014/0284583 A1 | 9/2014 | Saitoh et al. | |
| 2014/0322554 A1* | 10/2014 | Arita | G02B 5/3083 428/522 |
| 2014/0375935 A1* | 12/2014 | Yamada | G02B 5/3025 349/103 |
| 2015/0168624 A1* | 6/2015 | Yaginuma | G02B 1/04 359/489.07 |

FOREIGN PATENT DOCUMENTS

| | | |
|---|---|---|
| JP | 2014-209219 A | 11/2014 |
| JP | 2014-215360 A | 11/2014 |
| KR | 10-0807140 B1 | 2/2008 |
| WO | 2013/137464 A1 | 9/2013 |

OTHER PUBLICATIONS

Written Opinion issued in PCT/JP2016/060102 dated May 10, 2016.
International Preliminary Report on Patentability completed by WIPO on Jul. 18, 2017, in connection with International Patent Application No. PCT/JP2016/060102.

* cited by examiner

CIRCULARLY POLARIZING PLATE AND DISPLAY DEVICE

CROSS-REFERENCE TO RELATED APPLICATIONS

This application is a Continuation of PCT International Application No. PCT/JP2016/060102 filed on Mar. 29, 2016, which was published under PCT Article 21(2) in Japanese, and which claims priority under 35 U.S.C. § 119(a) to Japanese Patent Application No. 2015-068881 filed on Mar. 30, 2015. The above applications are hereby expressly incorporated by reference, in their entirety, into the present application.

BACKGROUND OF THE INVENTION

1. Field of the Invention

The present invention relates to a circularly polarizing plate and a display device having a circularly polarizing plate.

2. Description of the Related Art

Conventionally, in order to suppress adverse effects caused by reflection of external light, a circularly polarizing plate has been used for an organic EL display device, a liquid crystal display device, and the like.

For the circularly polarizing plate, an aspect in which a phase difference plate (so-called broadband λ/4 plate) including a λ/2 plate and a λ/4 plate is combined with a polarizer is suitably used and for example, a similar configuration is disclosed in WO2013/137464A.

SUMMARY OF THE INVENTION

On the other hand, in recent years, there has been a demand for further improving the durability of a display device, and specifically, there has been a demand for reducing the amount of change in tint and a difference in reflectivity between the center portion and the side edge portion of a display device exposed to a high temperature environment.

In addition, from the viewpoint of thinning the display device, there has been a demand for thinning a circularly polarizing plate to be used at the same time.

When the present inventors attached the circularly polarizing plate specifically disclosed in WO2013/137464A to a display device and evaluated durability thereof, the durability met the level required in the related art but did not meet a level higher than recently required and further improvement was required.

An object of the present invention is to provide a circularly polarizing plate capable of reducing the amount of change in tint and a difference in reflectivity while achieving thinning of a display device and a display device having the same.

As a result of intensive investigations for solving the above problems, the present inventors have found that the amount of change in tint and a difference in reflectivity can be reduce while achieving thinning of a display device by using a transparent support having a thickness of 50 μm or less and having a ratio between a maximum value and a minimum value of modulus of elasticity (maximum value/ minimum value) in a plane set to be in a predetermined range as a transparent support that is present between a polarizer and an optically anisotropic layer, and thus have completed the present invention.

That is, it has been found that the above object can be achieved by adopting the following configurations.

[1] A circularly polarizing plate comprising: a polarizer; a transparent support; and an optically anisotropic layer including a liquid crystal compound, in this order, in which the optically anisotropic layer satisfies Expression (1), and the transparent support has a thickness of 50 μm or less and satisfies Expression (2), $$100 \leq Re(550) \leq 180 \text{ nm} \tag{1}$$

$$1.00 \leq R \leq 1.20 \tag{2}$$

in Expression (1), Re(550) represents an in-plane retardation of the optically anisotropic layer at a wavelength of 550 nm, and in Expression (2), R represents a ratio between a maximum value and a minimum value of modulus of elasticity of the transparent support.

[2] The circularly polarizing plate according to [1], in which the optically anisotropic layer is a laminate having a λ/2 plate and a λ/4 plate.

[3] The circularly polarizing plate according to [2], in which the circularly polarizing plate has the polarizer, the transparent support, the λ/2 plate, and the λ/4 plate in this order.

[4] The circularly polarizing plate according to any one of [1] to [3], in which the thickness of the transparent support is 40 μm or less.

[5] The circularly polarizing plate according to any one of [1] to [4], in which the transparent support satisfies Expression (3), $$1.00 \leq R \leq 1.16 \tag{3}$$

in Expression (3), R represents a ratio between a maximum value and a minimum value of modulus of elasticity of the transparent support.

[6] The circularly polarizing plate according to any one of [1] to [5] that is used an organic electroluminescence display device.

[7] A display device comprising: the circularly polarizing plate according to any one of [1] to [6].

According to the present invention, it is possible to provide a circularly polarizing plate capable of reducing the amount of change in tint and a difference in reflectivity while achieving thinning of a display device, and a display device having the same.

DESCRIPTION OF THE PREFERRED EMBODIMENTS

Figure 1:
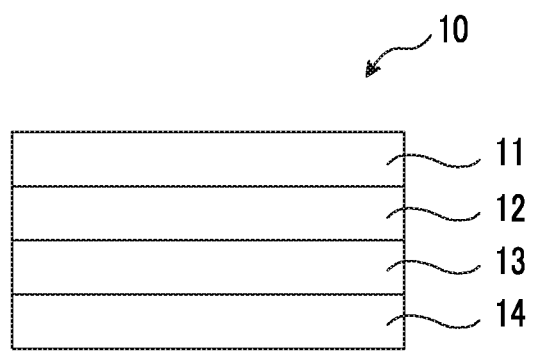
FIG. 1 is a schematic cross-sectional view showing an example of an embodiment of a circularly polarizing plate of the present invention.

The present invention will be hereunder described in detail.

The following description of the constitutional requirements is made on the basis of representative embodiments of the present invention, but it should not be construed that the present invention is limited to those embodiments.

In the present specification, numerical value ranges expressed by the term "to" mean that the numerical values described before and after "to" are included as a lower limit and an upper limit, respectively.

In addition, it is defined that the terms "perpendicular" and "parallel" with respect to angle mean ranges expressed by precise angle ±10°, and the terms "equal" and "different" with respect to angle can be determined based on a criterion that whether the difference is less than 5° or not.

In the present specification, the term "visible light" refers to light in a wavelength range of 380 to 780 nm. Further, in the present specification, the measurement wavelength is 550 run unless otherwise specified regarding the measurement wavelength.

Next, terms used in the present specification will be described.

<Circularly Polarizing Plate>

In the present specification, the term "circularly polarizing plate" includes both a long circularly polarizing plate and a circularly polarizing plate which is cut into a size that can be incorporated in a display device unless otherwise specified. The term "cutting" used herein includes "punching", "slicing", and the like.

<Slow Axis>

In the present specification, the term "slow axis" means a direction in which a refractive index becomes maximum in a plane. In a case of mentioning a slow axis of a optically anisotropic layer, the slow axis in this case means the slow axis of the entire optically anisotropic layer.

<Re(λ) and Rth(Δ)>

In the present specification, the terms "Re(λ)" and "Rth (λ)" represent the in-plane retardation at a wavelength λ and the retardation in a thickness direction, respectively.

Re(λ) is measured by applying light having a wavelength of λ nm to a film in the normal direction of the film, in KOBRA 21ADH or KOBRA WR (both manufactured by Oji Scientific Instruments). For selection of the measurement wavelength of λ nm, measurement can be performed by manually exchanging the wavelength selective filter or converting the measured values by a program or the like.

In a case where the film to be measured is expressed as a uniaxial or biaxial refractive index ellipsoid, Rth(λ) is calculated in the following manner.

Rth(λ) is measured in the following manner. Re(λ) is measured at six points in total by making light having a wavelength of a nm incident on the film in the directions tilted from the normal direction of the film with the in-plane slow axis (which is determined with KOBRA 21ADH or KOBRA WR) as the tilt axis (rotation axis) (in the case in which there is no slow axis, an arbitrary in-plane direction of the film is used as the rotation axis) to 50 degrees on one side of the film in the normal direction with a step of 10 degrees, and Rth(λ) is calculated by KOBRA 21ADH or KOBRA WR based on the retardation values thus measured, the assumed value of the average refractive index, and the input film thickness value.

In the above description, in a case of a film that has a direction in which the retardation value thereof is zero at a certain tilt angle relative to the in-plane slow axis thereof in the normal direction taken as a rotation axis, the sign of the retardation value at a tilt angle larger than the tilt angle is converted into the corresponding negative value and then calculated by KOBRA 21ADH or KOBRA WR.

Additionally, with the slow axis taken as the tilt axis (rotation axis) (in the case in which the film does not have a slow axis, an arbitrary in-plane direction of the film may be taken as the rotation axis), the retardation values are measured in two arbitrary tilted directions and, based on the above values, the assumed value of average refractive index, and the inputted film thickness, Rth can be also calculated according to Expressions (1) and (2).

$$Re(\theta) = \left[ nx - \frac{ny \times nz}{\sqrt{\left\{ ny\sin\left(\sin^{-1}\left(\frac{\sin(-\theta)}{nx}\right)\right)\right\}^2 + \left\{ nz\cos\left(\sin^{-1}\left(\frac{\sin(-\theta)}{nx}\right)\right)\right\}^2}} \right] \times \frac{d}{\cos\left\{\sin^{-1}\left(\frac{\sin(-\theta)}{nx}\right)\right\}}$$

Expression (1)

$$Rth = \left(\frac{nx + ny}{2} - nz\right) \times d$$

Expression (2)

In the expressions, Re(θ) represents a retardation value in a direction tilted by an angle θ from the normal direction. nx represents a refractive index in the in-plane slow axis direction, ny represents a refractive index in the in-plane direction perpendicular to nx, and nz represents a refractive index in the direction perpendicular to nx and ny. d represents a film thickness.

In the case in which the film to be measured cannot be expressed by a uniaxial or biaxial index ellipsoid, that is, the film that does not have a so-called optical axis, Rth(λ) is calculated according to the following method.

Rth(λ) is measured in the following method. Re(λ) is measured at eleven points by making light having a wavelength of λ nm incident on the film in each of the tilt directions of from −50 degrees to +50 degrees with a step of 10 degrees with respect to the normal direction of the film with the in-plane slow axis (which is determined with KOBRA 21ADH or KOBRA WR) as the tilt axis (rotation axis), and Rth(λ) is calculated by KOBRA 21ADH or KOBRA WR based on the retardation values thus measured, the assumed value of the average refractive index, and the input film thickness value.

In the above measurements, the assumed value of the average refractive index may be the values shown in Polymer Handbook (JOHN WILEY & SONS, INC) and the brochures of various optical films. For the film with an unknown average refractive index, the film may be measured for the average refractive index with an Abbe refractometer. Examples of the average refractive indices of the major optical films are shown below; cellulose acylate (1.48), cycloolefin polymer (1.52), polycarbonate (1.59), polymethyl methacrylate (1.49), and polystyrene (1.59). In a case where the assumed value of the average refractive index and the film thickness are inputted, the values of nx, ny and nz are calculated by KOBRA 21ADH or KOBRA WR. The expression of Nz=(nx−nz)/(nx−ny) is further calculated based on the calculated values of nx, ny and nz.

<Modulus of Elasticity>

In the present specification, the "modulus of elasticity" of the transparent support is a tensile modulus of elasticity obtained from an initial slope of a stress-strain curve by preparing a sample having a length of 150 mm and a width of 10 mm, conditioning the humidity of the sample at 25° C. and a relative humidity of 60% for 24 hours, and then measuring the sample at initial sample length of 100 mm and a tensile speed of 10 mm/min in accordance with the standard of ISO527-3:1995.

In addition, the term "maximum value of modulus of elasticity" refers to a modulus of elasticity measured by conditioning the humidity of the transparent support at 25° C. and a relative humidity of 60% for 24 hours and then measuring the transparent support in a direction in which the propagation speed of longitudinal wave vibrations of the ultrasonic pulses is greatest using an alignment measuring device (SST-2500: manufactured by Nomura Shoji Co., Ltd.), and the term "maximum value of modulus of elasticity" refers to a modulus of elasticity measured by conditioning the humidity of the transparent support at 25° C. and a relative humidity of 60% for 24 hours and then measuring the transparent support in a direction in which the propagation speed of longitudinal wave vibrations of the ultrasonic pulses is smallest using an alignment measuring device (SST-2500: manufactured by Nomura Shoji Co., Ltd.).

Further, the term "ratio between a maximum value and a minimum value of modulus of elasticity" (R in Expression (2) which will be described later) refers to a ratio between a maximum value with respect to a minimum value of modulus of elasticity (maximum value/minimum value) and in a case in which the maximum value and the minimum value of the modulus of elasticity are the same, the ratio is 1.

[Circularly Polarizing Plate]

A circularly polarizing plate of the present invention is a circularly polarizing plate including a polarizer, a transparent support, and an optically anisotropic layer including a liquid crystal compound in this order, in which the optically anisotropic layer satisfies Expression (1) and the transparent support has a thickness of 50 μm or less and satisfies Expression (2).

$$100 \leq Re(550) \leq 180 \text{ nm} \quad (1)$$

$$1.00 \leq R \leq 1.20 \quad (2)$$

In Expression (1), Re(550) represents an in-plane retardation of the optically anisotropic layer at a wavelength of 550 nm and in Expression (2), R represents a ratio between a maximum value and a minimum value of modulus of elasticity of the transparent support (hereinafter, abbreviated as "elastic ratio R").

With this configuration, the amount of change in tint and a difference in reflectivity can be reduced while achieving thinning of a display device.

Although the details are not clear, the present inventors are assumed as follows.

That is, it is considered that the amount of change in tint and a difference in reflectivity between a center portion and a side edge portion of a display device that is exposed to a high temperature environment are increased due to a dimensional change (expansion) of the transparent support in the high temperature environment. Specifically, it is considered that dehydration more easily occurs in the side edge portion of the transparent support than in the center portion, a difference in expansion is generated between the side edge portion and the center portion of the transparent support, and as a result, the optical properties of the center portion and the side edge portion are changed.

Therefore, in the present invention, it is considered that a change in optical properties associated with contraction can be suppressed by setting the elastic ratio R of the transparent support to be in a predetermined range.

Next, the entire configuration of the circularly polarizing plate of the present invention will be described using FIGS. 1 to 3 and then the configuration of each portion will be described in detail.

Figure 2:
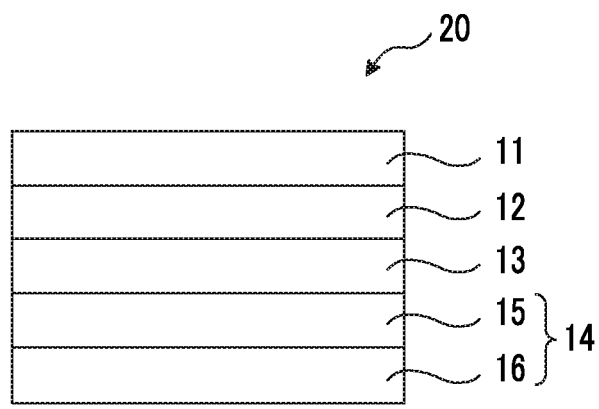
FIG. 2 is a schematic cross-sectional view showing an example of an embodiment of a circularly polarizing plate of the present invention.
Figure 3:
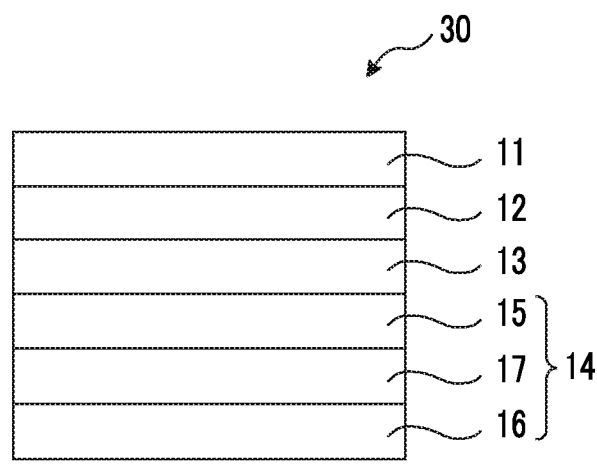
FIG. 3 is a schematic cross-sectional view showing an example of an embodiment of a circularly polarizing plate of the present invention.

FIGS. 1 to 3 are schematic cross-sectional views showing examples of embodiments of the circularly polarizing plate of the present invention, respectively.

As shown in FIGS. 1 to 3, each of circularly polarizing plates 10, 20, and 30 includes a polarizer 12, a transparent support 13, and an optically anisotropic layer 14 in this order and may have a polarizer protective film 11.

In addition, the circularly polarizing plate 20 shown in FIG. 2 has a λ/2 plate 15 and a λ/4 plate 16 for the optically anisotropic layer 14, and the circularly polarizing plate 30 shown in FIG. 3 has a λ/2 plate 15, the another transparent support 17, and a λ/4 plate 16 for the optically anisotropic layer 14.

[Polarizer]

The polarizer of the circularly polarizing plate of the present invention may be a member having a function of converting light into specific linearly polarized light (linear polarizer) and an absorptive type polarizer can be mainly used.

As the absorptive type polarizer, an iodine-based polarizer, a dye-based polarizer using a dichroic dye, a polyene-based polarizer, and the like are used. The iodine-based polarizer and the dye-based polarizer are a coating type polarizer and a stretching type polarizer, and any one of these polarizers can be applied. Among these, a polarizer, which is prepared by allowing polyvinyl alcohol to adsorb iodine or a dichroic dye, and performing stretching, is preferable.

In addition, examples of a method of obtaining a polarizer by performing stretching and dyeing in a state of a laminated film in which a polyvinyl alcohol layer is formed on a substrate include methods disclosed in JP5048120B, JP5143918B, JP4691205B, JP4751481B, and JP475486B, and known technologies related to these polarizers can be preferably used.

Among these, from the viewpoint of handleability, a polarizer containing a polyvinyl alcohol-based resin (a polymer including —$CH_2$—CHOH— as a repeating unit, in particular, at least one selected from the group consisting of polyvinyl alcohol and an ethylene-vinyl alcohol copolymer is preferable) is preferable.

The thickness of the polarizer is not particularly limited but from the viewpoint of achieving excellent handleability and excellent optical properties, the thickness is preferably 35 μm or less, more preferably 3 to 25 μm, and even more preferably 4 to 20 μm. Within the thickness range, a display device can be made thin.

[Transparent Support]

The transparent support of the circularly polarizing plate of the present invention is a layer that is provided between the above-described polarizer and the optically anisotropic layer which will be descried later. The transparent support is a layer corresponding to a transparent support 12 in the circularly polarizing plate 30 shown in FIG. 3, and the another transparent support 17 is a layer included in the optically anisotropic layer 14.

As the material for forming the transparent support, a polymer excellent in optical transparency, mechanical strength, heat stability, moisture shielding properties, isotropy, and the like is preferable. The term "transparent" used in the present invention denotes that the transmittance of visible light is 60% or more, preferably 80% or more, and particularly preferably 90% or more.

Examples of a polymer film that can be used as the transparent support include polyolefins such as a cellulose acylate film (for example, cellulose triacetate film (refractive index: 1.48), a cellulose diacetate film, a cellulose acetate butyrate film, or a cellulose acetate propionate film), polyethylene, and polypropylene, polyester-based resin films such as polyethylene terephthalate and polyethylene naphthalate, polyacrylic resin films such as a polyether sulfone film and a polymethyl methacrylate, polyurethane-based resin films, polyester films, polycarbonate films, polysulfone films, polyether films, polymethyl pentene films, polyether ketone films, (meth)acrylonitrile films, and polymer films having an alicyclic structure (a norbornene-based resin (ARTON: trade name, manufactured by JSR Corporation), and amorphous polyolefin (ZEONEX: trade name, manufactured by ZEON Corporation)).

Among these, as the material for the polymer film, triacetyl cellulose, polyethylene terephthalate, or the polymers having an alicyclic structure is preferable, and triacetyl cellulose is particularly preferable.

In the present invention, the thickness of the transparent support is 50 μm or less, and for the reason that thinning of a display device is easily achieved, the thickness of the transparent support is preferably 40 μm or less and more preferably 20 to 40 μm.

In addition, in the present invention, the elastic ratio R of the transparent support satisfies Expression (2), preferably satisfies Expression (3), and more preferably satisfies Expression (4) for the reason that the amount of change in tint and a difference in reflectivity of a display device can be reduced.

$$1.00 \leq R \leq 1.20 \quad (2)$$

$$1.00 \leq R \leq 1.16 \quad (3)$$

$$1.00 \leq R \leq 1.12 \quad (4)$$

<Additive>

Various additives (for example, an optical anisotropy adjusting agent, a wavelength dispersion controlling agent, fine particles, a plasticizer, an ultraviolet ray inhibitor, a deterioration preventing agent, and a release agent) can be added to the transparent support. In addition, in a case in which the transparent support is a cellulose acylate film, the time for adding the additives may be any time in a dope preparing step (a step of preparing a cellulose acylate solution). However, a step of preparing a dope by adding the additives at the final stage of the dope preparing step may be performed.

<Method of Preparing Transparent Support>

In the present invention, a method of preparing the transparent support of which the thickness is 50 μm or less and the elastic ratio R satisfies Expression (2) is not particularly limited. In a case in which the transparent support is a cellulose acylate film, for example, a solution film formation method including casting a dope obtained by dissolving cellulose acylate in an organic solvent (cellulose acylate solution) from a casting die onto an endless belt or a drum (hereinafter, these are collectively abbreviated as "drum or the like") rotating in a casing, peeling off the dope from the drum or the like, and further drying the dope to form a film or the like may be used. Specifically, in the solution film formation method, a method of performing a stretching treatment in a transport direction (longitudinal direction) and a width direction (a direction perpendicular to a casting direction) during or after peeling off the dope from the drum or the like is suitably used.

Particularly, in the solution film formation method, the stretching ratio in the transport direction (longitudinal direction) is preferably 1.10 to 1.15 times and the stretching ratio in the width direction is preferably 1.06 to 1.09 times.

[Optically Anisotropic Layer]

The optically anisotropic layer of the circularly polarizing plate of the present invention includes a liquid crystal compound and is an optically anisotropic layer satisfying Expression (1). The optically anisotropic layer may adopt a single structure or may adopt a structure in which a plurality of layers are laminated (laminate). In a case in which the optically anisotropic layer is a laminate, at least one layer may include a liquid crystal compound but it is necessary for the laminate to satisfy Expression (1).

$$100 \leq Re(550) \leq 180 \text{ nm} \quad (1)$$

<Liquid Crystal Compound>

Generally, liquid crystal compounds can be classified into a rod-shaped type and a disk-shaped type on the basis of the shape thereof. Further, each type includes a low molecular type and a high molecular type. A high molecule generally indicates a molecule having a polymerization degree of 100 or more (Masao Doi; Polymer Physics-Phase Transition Dynamics, 1992, IWANAMI SHOTEN, PUBLISHERS, page 2). In the present invention, any type of liquid crystal compound can be used. It is preferable to sue a rod-like liquid crystal compound or a discotic liquid crystal compound (disk-like liquid crystal compound). A mixture of two types or more of rod-like liquid crystal compounds, two types or more of disk-like liquid crystal compounds, or a rod-like liquid crystal compound and a disk-like liquid crystal compound may be used. In order to fix the above-described liquid crystal compound, it is more preferable to use a rod-like liquid crystal compound or a disk-like liquid crystal compound having polymerizable group, and it is even more preferable that a liquid crystal compound has two or more polymerizable groups in one molecule. In a case in which the crystal compound is a mixture of two types or more types of liquid crystal compounds, it is preferable that at least one type of liquid crystal compound has two or more polymerizable groups in one molecule.

As the rod-like liquid crystal compound, for example, it is possible to preferably use those described in claim 1 of JP1999-513019A (JP-H11-513019A) or in paragraphs [0026] to [0098] of JP2005-289980A. As the discotic liquid crystal compound, for example, it is possible to preferably use those described in paragraphs [0020] to [0067] of JP2007-108732A or in paragraphs [0013] to [0108] of JP2010-244038A. However, the present invention is not limited thereto.

In the present invention, it is preferable that the optically anisotropic layer is a laminate having a λ/2 plate and a λ/4 plate for the reason that the laminate functions as the λ/4 plate in a wide range of wavelength.

<λ/2 Plate>

The λ/2 plate refers to an optically anisotropic layer of which the in-plane retardation $Re(\lambda)$ at a predetermined wavelength λ nm satisfies $Re(\lambda) \leq \lambda/2$. This expression may be satisfied at a wavelength in a visible light range (for example, 550 nm).

In the present invention, the in-plane retardation Re(550) of the λ/2 plate at a wavelength of 550 nm is preferably 205 to 275 nm and more preferably 215 to 265 nm.

Rth(550) of the λ/2 plate which is a retardation value measured at a wavelength of 550 nm in the thickness direction is preferably −240 to 240 nm and more preferably −160 to 160 nm from the viewpoint of further improving the effect of the present invention.

Although the thickness of the λ/2 plate is not particularly limited, the thickness of the λ/2 plate is preferably 0.5 to 10 μm and more preferably 0.5 to 5 μm for the reason that thinning of a display device is easily achieved.

The thickness means the average thickness and is obtained by measuring thicknesses at 5 arbitrary points in the λ/2 plate and arithmetically averaging these values.

The λ/2 plate includes a liquid crystal compound. The definition of the liquid crystal compound is as described above.

It is more preferable for the λ/2 plate to use a liquid crystal compound (rod-like liquid crystal compound or a disk-like liquid crystal compound) having a polymerizable group since changes in temperature and humidity in optical properties can be reduced. The liquid crystal compound may be a mixture of two types or more of liquid crystal compounds may be used and in this case, it is preferable that at least one liquid crystal compound has two or more polymerizable groups.

That is, it is preferable that the λ/2 plate is a layer formed by fixing a rod-like liquid crystal compound having a polymerizable group or a disk-like liquid crystal compound having a polymerizable group through polymerization or the like. In this case, after the layer is formed, the liquid crystal compound does not need to exhibit liquid crystallinity.

The type of polymerizable group included in the rod-like liquid crystal compound or the disk-like liquid crystal compound is not particularly limited and a functional group capable of causing an addition polymerization reaction is preferable. A polymerizable ethylenically unsaturated group or a cyclic polymerizable group is preferable. More specifically, a (meth)acryloyl group, a vinyl group, a styryl group, and an allyl group are preferable and a (meth)acryloyl group is more preferable. The (meth)acryloyl group is a concept including both a methacryloyl group and an acryloyl group.

The method of forming the λ/2 plate is not particularly limited and a known method may be used.

For example, a coating film is formed by applying an optically anisotropic layer forming composition including a liquid crystal compound having a polymerizable group (hereinafter, also simply referred to as "composition") to a predetermined substrate (including a temporary substrate) and the obtained coating film is subjected to a curing treatment (irradiation with ultraviolet rays (light irradiation treatment) or heating treatment) so that a λ/2 plate can be produced. If required, an alignment film, which will be described later, may be used.

The composition can be applied by a known method (for example, a wire bar coating method, an extrusion coating method, a direct gravure coating method, a reverse gravure coating method, or a die coating method).

The composition may include components other than the above liquid crystal compound.

For example, the composition may include a polymerization initiator. The polymerization initiator to be used is selected according to the polymerization reaction mode and examples thereof include a thermal polymerization initiator and a photopolymerization initiator. Examples of the photopolymerization initiator include an α-carbonyl compound, acyloin ether, an α-hydrocarbon-substituted aromatic acyloin compound, a polynuclear quinone compound, and a combination of triaryl imidazole dimer and p-aminophenylketone.

The amount of the polymerization initiator used is preferably 0.01% to 20% by mass and more preferably 0.5% to 5% by mass with respect to the total solid content of the composition.

In addition, the composition may include a polymerizable monomer from the viewpoint of evenness of a coating film and film strength.

Examples of the polymerizable monomer include a radical polymerizable or a catatonical polymerizable compound. Preferable is a polyfunctional radical polymerizable monomer, and a monomer copolymerizable with the liquid crystal compound having a polymerizable group is more preferable. For example, those described in paragraphs [0018] to [0020] of JP2002-296423A may be used.

The amount of the polymerizable monomer added is preferably 1% to 50% by mass and more preferably 2% to 30% by mass with respect to the total mass of the liquid crystal compound.

In addition, the composition may include a surfactant from the viewpoint of evenness of a coating film and film strength.

As the surfactant, a conventionally known compound may be used and a fluorine-based compound is particularly preferable. Specific examples thereof include compounds described in paragraphs [0028] to [0056] of JP2001-330725A, and compounds described in paragraphs [0069] to [0126] of JP2003-295212A.

In addition, the composition may include a solvent and an organic solvent is preferably used. Examples of the organic solvent include amides (for example, N,N-dimethylformamide), sulfoxides (for example, dimethylsulfoxide), heterocyclic compounds (for example, pyridine), hydrocarbons (for example, benzene, hexane), alkyl halides (for example, chloroform, and dichloromethane), esters (for example, methyl acetate, ethyl acetate, and butyl acetate), ketones (for example, acetone, and methyl ethyl ketone), and ethers (for example, tetrahydrofuran, and 1,2-dimethoxyethane). Alkyl halides and ketones are preferable. These organic solvents may be used alone or in combination of two or more thereof.

In addition, the composition may include various aligning agents such as a vertical alignment promoter, such as a polarizer interface side vertical aligning agent or an air interface side vertical aligning agent, and a horizontal alignment promoter, such as a polarizer interface side horizontal aligning agent or an air interface side horizontal aligning agent.

Further, the composition may include an adhesion improver, a plasticizer, a polymer and the like, in addition to the above components.

<λ/4 Plate>

The λ/4 plate is a plate having a function of converting linearly polarized light having a specific wavelength into circularly polarized light (or circularly polarized light into linearly polarized light) and refers to an optically anisotropic layer of which the in-plane retardation Re(λ) at a specific wavelength λ nm satisfies Re(λ)=λ/4. This expression may be satisfied at a wavelength in a visible light range (for example, 550 nm).

In the present invention, the in-plane retardation Re(550) of the λ/4 plate at a wavelength of 550 nm is preferably 100 to 150 nm and more preferably 110 to 140 nm.

Rth(550) of the λ/4 plate which is a retardation value measured at a wavelength of 550 nm in the thickness direction is preferably −120 to 120 nm and more preferably −80 to 80 nm from the viewpoint of further improving the effect of the present invention.

Although the thickness of the λ/4 plate is not particularly limited, the thickness thereof is preferably 0.5 to 10 µm and more preferably 0.5 to 5 µm from the viewpoint of easily achieving thinning of a display device.

The thickness means the average thickness and is obtained by measuring the thicknesses at 5 points of the λ/4 plate and averaging the measured values.

The λ/4 plate includes a liquid crystal compound. The definition of the liquid crystal compound is as described above.

It is preferable that the λ/4 plate is a layer formed by fixing a liquid crystal compound (rod-like liquid crystal compound or disk-like liquid crystal compound) having a polymerizable group through polymerization or the like. In this case, after the layer is formed, the liquid crystal compound does not need to exhibit liquid crystallinity.

In the present invention, in a case in which the laminate having the above-described λ/2 plate and λ/4 plate is used as the optically anisotropic layer, for the reason that the laminate function as a circularly polarizing plate in a wide range of wavelength, it is preferable that the circularly polarizing plate has the above-described polarizer, transparent support, λ/2 plate and λ/4 plate in this order. In addition, it is preferable that an angle formed between the in-plane slow axis of the λ/4 plate and the in-plane slow axis of the λ/2 plate is 600.

In the present invention, in the case in which the laminate having the above-described λ/2 plate and λ/4 plate is used as an optically anisotropic layer. within a range not impairing the effect of the present invention, layers other than the λ/2 plate and the λ/4 plate may be included.

Examples of other layers include a transparent support (hereinafter, referred to as "another transparent support" from the viewpoint of distinguishing this transparent support from the above-described transparent support) to be provided between the λ/2 plate and the λ/4 plate, and an alignment film to be provided between the transparent support and the λ/2 plate or between another transparent support and the λ/4 plate.

<Another Transparent Support>

The material for forming another transparent support is the same as the material for forming the above-described transparent support. Another transparent support is difference from the above-described transparent support and it is not necessary for another transparent support to have a thickness of 50 µm or less and to satisfy Expression (2).

The thickness of another transparent support is preferably 50 m or less, more preferably 40 µm or less, and even more preferably 20 to 40 µm from the viewpoint of easily achieving thinning of a display device.

<Alignment Film>

The alignment film is a layer having a function of defining an alignment direction of the liquid crystal compound and has generally a polymer as a main component.

The polymer materials for the alignment film are mentioned in a large number of literatures, and a large number of commercial products are available. The polymer material used is preferably polyvinyl alcohol or polyimide, and derivatives thereof. Particularly, modified or unmodified polyvinyl alcohols are preferable. Regarding the alignment film that can be used in the present invention, the modified polyvinyl alcohols described in WO01/88574A1, from page 43, line 24 to page 49, line 8, and paragraphs [0071] to [0095] of JP3907735B can be referred to. The alignment film is typically subjected to a known rubbing treatment. That is, the alignment film is preferably a rubbed alignment film which is subjected to a rubbing treatment.

Although the thickness of the alignment layer is not particularly limited, the thickness thereof is 20 µm or less in most cases and in this range, the thickness is preferably 0.01 to 10 µm, more preferably 0.01 to 1 µm, and even more preferably 0.01 to 0.5 µm.

[Other Layers]

The circularly polarizing plate of the present invention may include layers other than the above-described polarizer, transparent support, and optically anisotropic layer within a range not impairing the effect of the present invention.

In the circularly polarizing plate of the present invention, a polarizer protective film may be arranged on the surface of the above-described polarizer (the surface on the side opposite to the side on which the transparent support is provided).

The configuration of the polarizer protective film is not particularly limited. The polarizer protective film may be, for example, the above-described another transparent support, a hard coat layer, and a laminate of the above-described another transparent support and a hard coat layer.

As the hard coat layer, a known layer can be used and for example, a layer obtained by polymerizing and curing a polyfunctional monomer may be used.

Although the thickness of the polarizer protective film is not particularly limited, the thickness thereof is preferably 40 µm or less and more preferably 25 µm or less for the reason that thinning of a display device is easily achieved.

In addition, in the circularly polarizing plate of the present invention, in order to adhesiveness between each layer, an adhesive layer or a pressure sensitive adhesive layer may be arranged between each layer.

[Display Device]

A display device of the present invention is a display device having the above-described circularly polarizing plate of the present invention.

Since the circularly polarizing plate of the present invention is suitably used for antireflective applications, examples of the display device of the present invention include an organic electroluminescence (EL) display device (Organic Electro Luminescence Display: OELD), a liquid crystal display device (LCD), a plasma display panel (PDP), and a cathode tube display device (Cathode Ray Tube: CRT). Among these, the display device of the present invention is preferably an organic EL display device.

Hereinafter, a case of an organic EL display device including the circularly polarizing plate of the present invention will be described in detail.

[Organic EL Display Device]

Figure 4:
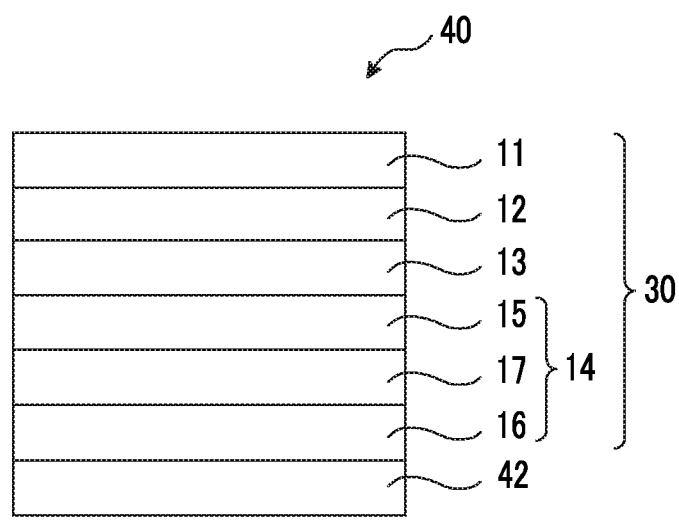
FIG. 4 is a schematic cross-sectional view showing an example of an embodiment of a display device of the present invention (organic electroluminescence display device).

An organic EL display device which is a suitable embodiment of the display device of the present invention has the above-described circularly polarizing plate. In general, the circularly polarizing plate is provided on an organic EL panel of an organic EL display device. More specifically, as shown in FIG. 4, an organic EL display device 40 has at least an organic EL panel 42, and a circularly polarizing plate 30. The configuration of the circularly polarizing plate 30 is as shown in FIG. 3.

The organic EL panel is a member in which a light emitting layer or a plurality of thin organic compound films including a light emitting layer is formed between a pair of electrodes of an anode and a cathode, and may have a positive hole injection layer, a positive hole transport layer, an electron injection layer, an electron transport layer, a protective layer, and the like in addition to the light emitting layer. Each of these layers may have different functions. Various materials can be used to form these layers.

The anode is to supply positive holes into the positive hole injection layer, the positive hole transporting layer, the light emitting layer, and the like. For the anode, metals, alloys, metal oxides, electroconductive compounds, or mixtures thereof can be used, and materials having a work function of 4 eV or more are preferable. Specific examples include conductive metal oxides such as tin oxide, zinc oxide, indium oxide, and indium tin oxide (ITO), metals such as gold, silver, chromium, and nickel, mixtures or laminates of these metals and conductive metal oxides, inorganic conductive substances such as copper iodide and copper sulfide, organic conductive materials such as polyanilines, polythiophenes, and polypyrroles, and laminates thereof with ITO, and preferably conductive metal oxides. ITO is particularly preferable from the viewpoint of productivity, high conductivity, transparency, and the like. The film thickness of the anode can be appropriately selected according to the material but in general, is preferably in the range of 10 nm to 5 µm, more preferably 50 nm to 1 µm, and even more preferably 100 nm to 500 nm.

EXAMPLES

Hereinafter, the present invention will be described in more detail base on examples. The materials, the amount of the materials used, the ratio between the materials, the content and the procedures of treatment, and the like shown in the following examples can be appropriately modified as long as the modification does not depart from the gist of the present invention. Accordingly, the scope of the present invention is not limited to the following specific examples.

<Preparation of Cellulose Acylate Film (Transparent Support)>

(1) Preparation of Cellulose Acylate Solution A

The following composition was put into a mixing tank and was stirred while being heated to dissolve the respective components, thereby preparing a cellulose acylate solution A.

| Composition of Cellulose Acylate Solution A | |
|---|---|
| Cellulose acetate (acetalization degree: 2.86) | 100 parts by mass |
| Triphenyl phosphate | 7.6 parts by mass |
| Biphenyl diphenyl phosphate | 3.8 parts by mass |
| Methylene chloride | 320 parts by mass |
| Methanol | 83 parts by mass |
| Butanol | 3 parts by mass |

(2) Preparation of Matting Agent Dispersion Liquid

Next, the following composition including the prepared cellulose acylate solution A was put into a dispersing machine to prepare a matting agent dispersion liquid M.

| Composition of Matting Agent Dispersion Liquid M | |
|---|---|
| Matting agent (AEROSIL R972) | 10 parts by mass |
| Methylene chloride | 72.8 parts by mass |
| Methanol | 3.9 parts by mass |
| Butanol | 0.5 parts by mass |
| Cellulose acylate solution A | 10.3 parts by mass |

(3) Preparation of Ultraviolet Absorbent Solution U

The following composition including the prepared cellulose acylate solution A was put into a separate mixing tank and was stirred while being heated to dissolve the respective components, thereby preparing an ultraviolet absorbent solution U-1.

| Composition of Ultraviolet Absorbent Solution U | |
|---|---|
| Ultraviolet absorbent (UV-1 below) | 10 parts by mass |
| Ultraviolet absorbent (UV-2 below) | 10 parts by mass |
| Methylene chloride | 55.7 parts by mass |
| Methanol | 10 parts by mass |
| Butanol | 1.3 parts by mass |
| Cellulose acylate solution A | 12.9 parts by mass |

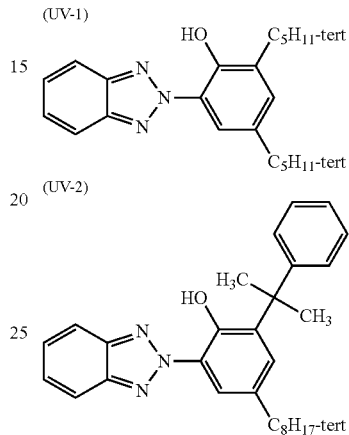

(4) Preparation of Cellulose Acylate Film

To a mixture obtained by mixing 94.6 parts by mass of the cellulose acylate solution A and 1.3 parts by mass of the matting agent dispersion liquid M, the ultraviolet absorbent solution U was added such that the amounts of the ultraviolet absorbent (UV-1) and the ultraviolet absorbent (UV-2) were respectively 1.0 part by mass per 100 parts by mass of cellulose acylate. Then, the mixture was fully stirred while being heated to dissolve the respective components, thereby preparing a dope.

The obtained dope was heated to 30° C. and was allowed to pass through a casting geeser, thereby casting the dope on a mirror surface stainless support which is a drum having a diameter of 3 m. The surface temperature of the mirror surface stainless support was set to −5° C. and the coating width was set to 1,470 mm.

The cast dope film was dried on the drum by dry air at 34° C. at 150 m³/min and in a state in which the residual solvent was 150%, the film was peeled off from the drum. In a case in which the film was peeled off from the drum, the film was stretched by 15% in the transport direction (longitudinal direction) of the film.

Thereafter, while holding the both ends of the film in the width direction of the film (a direction perpendicular to the casting direction) with a pin tenter (the pin tenter described in FIG. 3 of JP1992-1009A (JP-H04-1009A)), the film was transported and stretched in the width direction of the film at a stretching ratio shown in Table 1 below.

In this manner, cellulose acylate films 1 to 12 each having thickness shown in Table 1 below were prepared.

Regarding the prepared cellulose acylate films 1 to 12, a maximum value and a minimum value of modulus of elasticity and a ratio of these values (elastic ratio R) were measured in the above-described manner. The results thereof are shown in Table 1 below.

Example 1

<Saponification Treatment of Cellulose Acylate Film>

The cellulose acylate film 1 obtained above was allowed to pass between induction heating rolls at a temperature of 60° C. to increase the surface temperature of the film to 40° C. Then, an alkali solution of the following composition was applied to one surface of the film in a coating amount of 14 ml/m² using a bar coater. The film was retained for 10 seconds under a steam type infrared ray heater (manufactured by NORITAKE Co., Limited) heated to 110° C.

Next, pure water was applied to the film in an amount of 3 mL/m² similarly using a bar coater.

Next, the procedures of washing with water by a fountain coater and removing water by an air knife were repeatedly performed on the obtained cellulose acylate film 3 times. Thereafter, the film was retained in a 70° C. drying zone to be dried for 5 seconds, and thus a cellulose acylate film which had been subjected to a saponification treatment was prepared.

| Composition of Alkali Solution | |
|---|---|
| Potassium hydroxide | 4.7 parts by mass |
| Water | 15.7 parts by mass |
| Isopropanol | 64.8 parts by mass |
| Surfactant ($C_{16}H_{33}O(CH_2CH_2O)_{10}H$) | 1.0 part by mass |
| Propylene glycol | 14.9 parts by mass |

<Formation of Alignment Film>

An alignment film forming coating liquid having the following composition was applied to the saponification-treated surface of the obtained cellulose acylate film, which had been subjected to the saponification treatment, in an amount of 24 m/m² using a wire bar and then dried with hot air at 100° C. for 120 seconds.

| Composition of Alignment Film Forming Coating Liquid | |
|---|---|
| Modified polyvinyl alcohol shown below | 28 parts by mass |
| Citric acid ester (AS3, manufactured by Sankyo Chemical Industry Co., Ltd.) | 1.2 parts by mass |
| Photoinitiator (IRGACURE 2959, manufactured by BASF SE) | 0.84 parts by mass |
| Glutaraldehyde | 2.8 parts by mass |
| Water | 699 parts by mass |
| Methanol | 226 parts by mass |

(Modified Polyvinyl Alcohol)

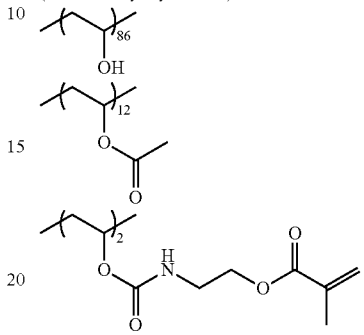

<Formation of λ/2 Plate (Optically Anisotropic Layer)>

The alignment film prepared above was continuously subjected to a rubbing treatment.

At this time, the longitudinal direction of the long film was parallel to the transport direction and the rubbing roller was adjusted such that the angle formed between the longitudinal direction of the film and the rotation axis of the rubbing roller was 75°.

An optically anisotropic layer coating liquid (A) including a discotic liquid crystal compound having the following composition was continuously applied to the alignment film prepared above with a wire bar. The transport velocity (V) of the film was 40 m/min.

In order to dry the solvent of the coating liquid and to align and age the discotic liquid crystal compound, the film was heated for 90 seconds by hot air at 120° C.

Next, UV irradiation was performed on the film at 80° C. to fix the alignment of the liquid crystal compound.

A film A in which the thickness of the optically anisotropic layer, that is, the thickness of the liquid crystal compound layer was adjusted to be 2 μm and Re(550) at 550 nm was 240 nm was obtained.

| Composition of Optically Anisotropic Layer Coating Liquid (A) | |
|---|---|
| Discotic liquid crystal compound-1 below | 80 parts by mass |
| Discotic liquid crystal compound-2 below | 20 parts by mass |
| Modified trimethylolpropane triacrylate | 5 parts by mass |
| Photopolymerization initiator (IRGACURE 907, manufactured by BASF SE) | 4 parts by mass |
| Pyridinium salt below | 2 parts by mass |
| Fluorine-based polymer (FP1) below | 0.21 parts by mass |
| Fluorine-based polymer (FP2) below | 0.1 parts by mass |
| Fluorine-based polymer (FP3) below | 0.05 parts by mass |
| Methyl ethyl ketone | 209 parts by mass |

(Discotic Liquid Crystal Compound-1)

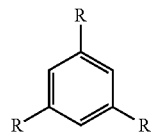

| Composition of Optically Anisotropic Layer Coating Liquid (A) |
|---|

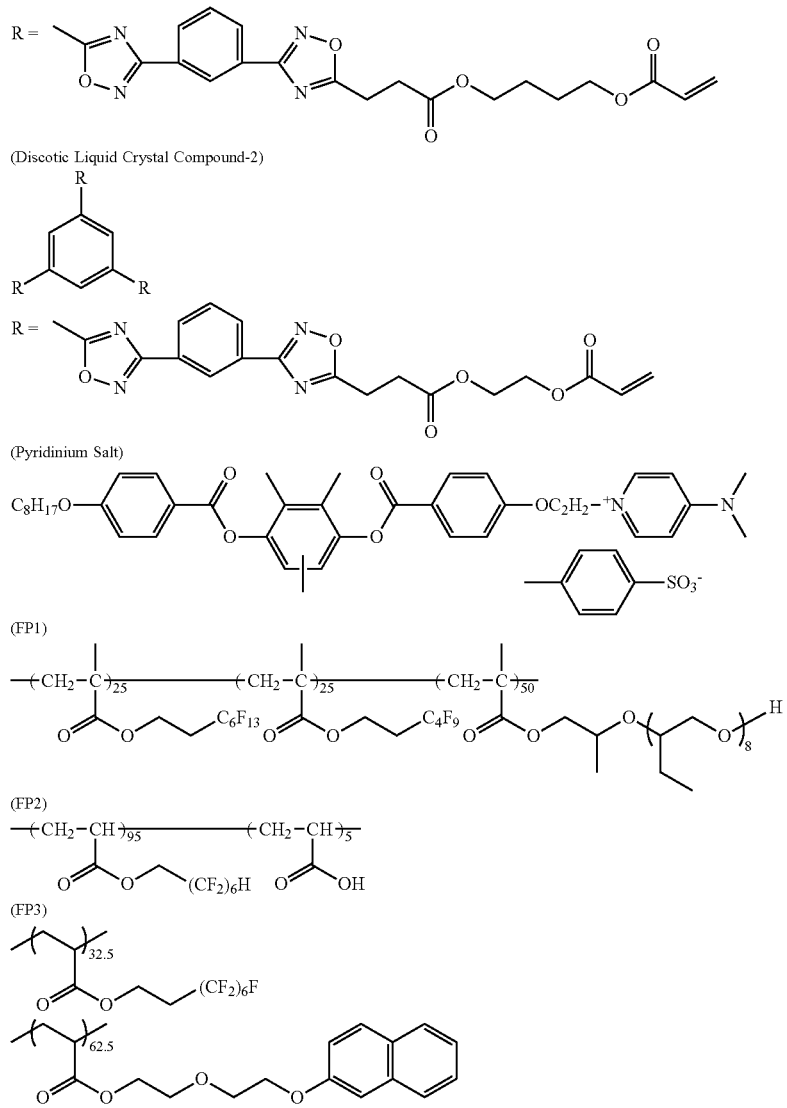

The direction of the slow axis of the prepared film A was parallel with the rotation axis of the rubbing roller. That is, the slow axis with respect to the longitudinal direction of the support was at 75° in a counterclockwise direction. It was confirmed that the average tilt angle of the disc surface of the discotic liquid crystal molecule with respect to the film surface was 90° and the discotic liquid crystal was arranged to be vertical to the film surface.

<Formation of λ/4 Plate (Optically Anisotropic Layer)>

The alignment film prepared above was continuously subjected to a rubbing treatment.

At this time, the longitudinal direction of the long film was parallel to the transport direction and the rubbing roller was adjusted such that the angle formed between the longitudinal direction of the film and the rotation axis of the rubbing roller was −15°.

An optically anisotropic layer coating liquid (B) including a discotic liquid crystal compound having the following composition was continuously applied to the alignment film prepared above with a wire bar. The transport velocity (V) of the film was 40 m/min. In order to dry the solvent of the coating liquid and to align and age the discotic liquid crystal compound, the film was heated for 90 seconds by hot air at 120° C. Subsequently, UV irradiation was performed on the film at 80° C. to fix the alignment of the liquid crystal compound. A film B in which the thickness of the optically anisotropic layer, that is, the thickness of the liquid crystal compound layer was adjusted to be 1 μm and Re(550) at 550 nm was 120 nm was obtained.

| Composition of Optically Anisotropic Layer Coating Liquid (B) | |
|---|---|
| Discotic liquid crystal compound-1 | 80 parts by mass |
| Discotic liquid crystal compound-2 | 20 parts by mass |
| Modified trimethylolpropane triacrylate | 10 parts by mass |
| Photopolymerization initiator (IRGACURE 907, manufactured by BASF SE) | 5 parts by mass |
| Pyridinium salt | 1 part by mass |

-continued

| Composition of Optically Anisotropic Layer Coating Liquid (B) | |
|---|---|
| Fluorine-based polymer (FP1) | 0.2 parts by mass |
| Fluorine-based polymer (FP2) | 0.1 parts by mass |
| Fluorine-based polymer (FP3) | 0.1 parts by mass |
| Methyl ethyl ketone | 337 parts by mass |

The direction of the slow axis of the prepared film B was vertical to the rotation axis of the rubbing roller. That is, the slow axis with respect to the longitudinal direction of the support was at 15° in a counterclockwise direction. It was confirmed that the average tilt angle of the disc surface of the discotic liquid crystal molecule with respect to the film surface was 90° and the discotic liquid crystal was arranged to be vertical to the film surface.

<Preparation of Polarizer>

A polyvinyl alcohol (PVA) film having a thickness of 80 μm was dyed by immersing the film in an aqueous iodine solution having an iodine concentration of 0.05% by mass for 60 seconds at 30° C. Then, the film was longitudinally stretched 5 times the original length while being immersed in an aqueous boric acid solution having a boric acid concentration of 4% by mass for 60 seconds, and then dried at 50° C. for 4 minutes. Thus, a polarizer having a thickness of 20 μm was obtained.

<Preparation of Polarizer Protective Film>

A commercially available cellulose acylate-based film "TD80UL" (manufactured by Fuji Film Corporation) was prepared and immersed in an aqueous sodium hydroxide solution (1.5 mol/liter) at 55° C. Thereafter, the film was fully washed with water to remove sodium hydroxide.

After the film was immersed in an aqueous diluted sulfuric acid solution (0.005 mol/liter) at 35° C. for 1 minute, the film was immersed in water and fully washed therein to remove the aqueous diluted sulfuric acid solution. Finally, the sample was fully dried at 120° C.

<Preparation of Circularly Polarizing Plate>

The polarizer prepared above and the surface of the film A in which the λ/2 plate was formed on the side opposite to the cellulose acylate film (transparent support) were laminated with a pressure sensitive adhesive.

Next, the surface of the film A on the side close to the λ/2 plate on which the polarizer and the surface of the film B in which the λ/4 plate was formed on the side close to the cellulose acylate film (another transparent support) were laminated with a pressure sensitive adhesive.

Next, the polarizer protective film was laminated on the surface of the polarizer using a polyvinyl-based pressure sensitive adhesive to prepare a circularly polarizing plate.

The configuration of the prepared circularly polarizing plate (excluding the pressure sensitive adhesive and alignment film) has the polarizer protective film, the polarizer, the transparent support, the λ/2 plate, the another transparent support, and the λ/4 plate in this order as in FIG. 4.

In addition, Re(550) of the optically anisotropic layer configured by the laminate of the λ/2 plate, the another transparent support, and the λ/4 plate at a wavelength of 550 nm was 143 nm.

Example 2

<Formation of λ/4 Plate (Optically Anisotropic Layer)>

The alignment film prepared above was continuously subjected to a rubbing treatment.

At this time, the longitudinal direction of the long film was parallel to the transport direction and the rubbing roller was adjusted such that the angle formed between the longitudinal direction of the film and the rotation axis of the rubbing roller was 45°.

The above-described optically anisotropic layer coating liquid (B) was continuously applied to the alignment film, which had been subjected to the rubbing treatment, with a wire bar. The transport velocity (V) of the film was 40 m/min. In order to dry the solvent of the coating liquid and to align and age the discotic liquid crystal compound, the film was heated for 90 seconds by hot air at 120° C. Next, UV irradiation was performed on the film at 80° C. to fix the alignment of the liquid crystal compound. A film C in which the thickness of the optically anisotropic layer, that is, the thickness of the liquid crystal compound layer was adjusted to be 1.2 μm and Re(550) at 550 nm was 138 nm was obtained.

the direction of the slow axis of the prepared film C was vertical to the rotation axis of the rubbing roller. That is, the slow axis with respect to the longitudinal direction of the support was at 45° in a counterclockwise direction. It was confirmed that the average tilt angle of the disc surface of the discotic liquid crystal molecule with respect to the film surface was 90° and the discotic liquid crystal was arranged to be vertical to the film surface.

<Preparation of Circularly Polarizing Plate>

The polarizer prepared in the same manner as in Example 1, and the surface of the film C in which the λ/4 plate was formed on the side opposite to the cellulose acylate film (transparent support) were laminated using a pressure sensitive adhesive.

Next, the polarizer protective film prepared in the same manner as in Example 1 was laminated on the surface of the polarizer using a polyvinyl-based pressure sensitive adhesive to prepare a circularly polarizing plate.

The configuration of the prepared circularly polarizing plate (excluding the pressure sensitive adhesive and the alignment film) has the polarizer protective film, the polarizer, the transparent support, and the λ/4 plate in this order as in FIG. 1.

Examples 3 to 6 and Comparative Examples 1 to 4 and 6 to 7

Circularly polarizing plates were prepared in the same manner as in Example 1 except that the cellulose acylate film shown in Table 1 below was used.

Comparative Example 5

A circularly polarizing plate was prepared in the same manner as in Example 2 except that the cellulose acylate film shown in Table 1 below was used.

[Mounting on Display Device]

An organic EL panel mounted GALAXY S4 manufactured by SAMSUNG Electronics Co., Ltd. was disassembled and a circularly polarizing plate was peeled off. Then, each of the prepared circularly polarizing plate was laminated on the device, thereby preparing a display device (organic EL display device).

[Durability Evaluation]

<Change in Tint and Reflectivity>

The prepared organic EL display device was exposed to an environment at 80° C. and a relative humidity of 25% for 80 hours and then the tint and reflectivity at the center portion and the side edge portion of the circularly polarizing plate were measured using aspectrophotometric colorimeter (CM-2022: manufactured by Konica Minolta, Inc.).

In order to determine a difference in tint, a distaste L between the coordinates of tint of the center portion and the side edge portion was calculated and shown in Table 1 below. In addition, regarding the reflectivity, a difference in reflectivity between the center portion and the side edge portion is shown in Table 1 below.

$$L=\sqrt{(a^*_C-a^*_R)^2+(b^*_C-b^*_R)^2}$$

$a^*_c$ and $b^*_c$ are the tint coordinates of the center portion.
$a^*_R$ and $b^*_R$ are the tint coordinates of the side edge portion.

EXPLANATION OF REFERENCES 10, 20, 30: circularly polarizing plate
11: polarizer protective film
12: polarizer
13: transparent support
14: optically anisotropic layer
15: λ/2 plate
16: λ/4 plate
17: another transparent support
40: organic EL display device
42: organic EL panel

TABLE 1

| | | Transparent support | | | | Optically anisotropic layer | | | Amount of change in tint distance L | Difference reflectivity between center portion and side edge portion |
|---|---|---|---|---|---|---|---|---|---|---|
| | | | Stretching ratio (width direction) | Modulus of elasticity | | Elastic ratio R | | | | |
| | Type | Thickness [µm] | | Maximum value [GPa] | Minimum value [GPa] | | λ/2 [nm] | λ/4 [nm] | Re(550) [nm] | | |
| Example 1 | Cellulose acylate film 1 | 40 | 8% | 4.77 | 4.71 | 1.01 | 240 | 120 | 143 | 0.38 | 0.20 |
| Example 2 | Cellulose acylate film 1 | 40 | 8% | 4.77 | 4.71 | 1.01 | — | 138 | 138 | 0.39 | 0.21 |
| Example 3 | Cellulose acylate film 2 | 40 | 7% | 4.27 | 3.84 | 1.11 | 240 | 120 | 143 | 0.38 | 0.25 |
| Example 4 | Cellulose acylate film 3 | 20 | 6% | 4.24 | 3.97 | 1.07 | 240 | 120 | 143 | 0.42 | 0.35 |
| Example 5 | Cellulose acylate film 4 | 20 | 9% | 5.01 | 4.40 | 1.14 | 240 | 120 | 143 | 0.49 | 0.37 |
| Example 6 | Cellulose acylate film 5 | 40 | 9% | 4.21 | 3.61 | 1.16 | 240 | 120 | 143 | 0.50 | 0.40 |
| Comparative Example 1 | Cellulose acylate film 6 | 40 | 18% | 5.77 | 4.65 | 1.24 | 240 | 120 | 143 | 0.58 | 0.48 |
| Comparative Example 2 | Cellulose acylate film 11 | 20 | 11% | 5.24 | 4.14 | 1.27 | 240 | 120 | 143 | 0.60 | 0.51 |
| Comparative Example 3 | Cellulose acylate film 7 | 40 | 0.4% | 5.35 | 4.15 | 1.29 | 240 | 120 | 143 | 0.82 | 0.53 |
| Comparative Example 4 | Cellulose acylate film 8 | 40 | 20% | 5.21 | 3.86 | 1.35 | 240 | 120 | 143 | 0.96 | 0.55 |
| Comparative Example 5 | Cellulose acylate film 12 | 40 | 0.4% | 5.35 | 4.15 | 1.29 | — | 138 | 138 | 1.02 | 0.63 |
| Comparative Example 6 | Cellulose acylate film 9 | 80 | 0% | 5.12 | 3.78 | 1.36 | 240 | 120 | 143 | 2.22 | 2.95 |
| Comparative Example 7 | Cellulose acylate film 10 | 60 | 3% | 5.11 | 3.79 | 1.35 | 240 | 120 | 143 | 1.76 | 1.83 |

As shown in Table 1, it was found that in a case in which the elastic ratio R of the transparent support present between the polarizer and the optically anisotropic layer was greater than 1.20, irrespective of whether or not the thickness of the transparent support was 50 µm or less, the amount of change in tint and a difference in reflectivity were increased (Comparative Examples 1 to 7). Particularly, it was found that in Comparative Examples 6 and 7 in which the thickness of the transparent support was more than 50 µm, the amount of change in tint and a difference in reflectivity were remarkably increased.

In contrast, it was found that in a case in which the thickness of the transparent support present between the polarizer and the optically anisotropic layer was 50 µm or less and the elastic ratio R was 1.00 or more and 1.20 or less, the amount of change in tint and a difference in reflectivity were decreased (Examples 1 to 6).

Particularly, it was found that in comparison of Examples 1 to 6, one having a smaller elastic ratio R tended to exhibit a small amount of change in tint and a small difference in reflectivity.

What is claimed is:

1. A circularly polarizing plate comprising:
   a polarizer;
   a transparent support; and
   an optically anisotropic layer including a liquid crystal compound, in this order,
   wherein the optically anisotropic layer satisfies Expression (1), and
   the transparent support has a thickness of 50 µm or less and satisfies Expression (2), $$100 \leq Re(550) \leq 180 \text{ nm} \quad (1)$$

$$1.00 \leq R < 1.08 \quad (2)$$

in Expression (1), Re(550) represents an in-plane retardation of the optically anisotropic layer at a wavelength of 550 nm, and in Expression (2), R represents a ratio between a maximum value and a minimum value of modulus of elasticity of the transparent support.

2. The circularly polarizing plate according to claim 1, wherein the optically anisotropic layer is a laminate having a λ/2 plate and a λ/4 plate.

3. The circularly polarizing plate according to claim 2, wherein the circularly polarizing plate has the polarizer, the transparent support, the λ/2 plate, and the λ/4 plate in this order.

4. The circularly polarizing plate according to claim 1, wherein the thickness of the transparent support is 40 µm or less.

5. The circularly polarizing plate according to claim 1 that is used an organic electroluminescence display device.

6. A display device comprising:
the circularly polarizing plate according to claim 1.

7. The circularly polarizing plate according to claim 2, wherein the thickness of the transparent support is 40 µm or less.

8. The circularly polarizing plate according to claim 3, wherein the thickness of the transparent support is 40 µm or less.

9. The circularly polarizing plate according to claim 2 that is used an organic electroluminescence display device.

10. The circularly polarizing plate according to claim 3 that is used an organic electroluminescence display device.

11. The circularly polarizing plate according to claim 4 that is used an organic electroluminescence display device.

12. A display device comprising:
the circularly polarizing plate according to claim 2.

13. A display device comprising:
the circularly polarizing plate according to claim 3.

14. A display device comprising:
the circularly polarizing plate according to claim 4.

15. The circularly polarizing plate according to claim 1, wherein the transparent support satisfies Expression (3), $$1.00 \leq R \leq 1.07 \qquad (3)$$

in Expression (3), R represents a ratio between a maximum value and a minimum value of modulus of elasticity of the transparent support.

16. The circularly polarizing plate according to claim 1, wherein the transparent support is a cellulose acylate film.

* * * * *